United States Patent [19]

Starov

[11] Patent Number: 5,201,960
[45] Date of Patent: Apr. 13, 1993

[54] METHOD FOR REMOVING PHOTORESIST AND OTHER ADHERENT MATERIALS FROM SUBSTRATES

[75] Inventor: Vladimir Starov, Redwood City, Calif.

[73] Assignee: Applied Photonics Research, Inc., Menlo Park, Calif.

[21] Appl. No.: 841,856

[22] Filed: Feb. 26, 1992

Related U.S. Application Data

[63] Continuation-in-part of Ser. No. 650,509, Feb. 4, 1991, abandoned.

[51] Int. Cl.[5] .......................... B08B 3/00; B08B 5/00; B08B 7/00
[52] U.S. Cl. ........................................ 134/11; 134/26; 134/30; 134/31; 134/37
[58] Field of Search ................. 134/11, 26, 30, 31, 134/37

[56] References Cited

U.S. PATENT DOCUMENTS

| | | | |
|---|---|---|---|
| 3,957,531 | 5/1976 | Tipping et al. | 134/31 |
| 3,969,196 | 7/1976 | Zosel | 208/308 |
| 4,303,454 | 12/1981 | Petterson et al. | 134/37 |
| 4,349,415 | 9/1982 | De Filippi et al. | 208/353 |
| 4,695,327 | 9/1987 | Grebinski | 134/11 |
| 4,778,536 | 10/1988 | Grebinski | 134/11 |
| 4,867,799 | 9/1989 | Grebinski | 134/11 |

Primary Examiner—Theodore Morris
Assistant Examiner—Zeinab El-Arini
Attorney, Agent, or Firm—Townsend and Townsend

[57] ABSTRACT

A method for removing adherent matrices, such as highly cross-linked photoresist layers, from substrates, such as semiconductor wafers, comprises exposing the matrix to a vapor phase solvent and allowing the solvent to penetrate the matrix. After penetration, the vapor is condensed and then revaporized in order to promote fragmentation of the matrix and facilitate removal. Optionally, the matrix may be treated with a pre-swelling solvent and the resulting fragments removed by washing with a liquid or vapor solvent for the fragmented matrix material.

36 Claims, 1 Drawing Sheet

METHOD FOR REMOVING PHOTORESIST AND OTHER ADHERENT MATERIALS FROM SUBSTRATES

This is a continuation of application Ser. No. 07/650,509 filed Feb. 4, 1991, now abandoned.

The present invention relates generally to methods for removing adherent layers from substrates, and more particularly to methods for removing photoresist layers from semiconductor wafers.

The fabrication of integrated circuits and other devices on semiconductor wafers depends on the photolithographic patterning of successive layers of materials applied on and into the wafer. In each photolithographic step, a layer of photoresist is applied to the wafer, soft baked, and patterned by exposure to radiation through a precisely aligned mask. Such exposure alters the solubility of the resist material in a particular solvent, thus allowing selective removal of the resist in accordance with the pattern defined by the mask. In this way, a precisely patterned protective layer is formed over the semiconductor wafer to limit subsequent fabrication steps to exposed locations on the wafer.

After the subsequent fabrication steps are completed, it becomes necessary to remove the remaining insoluble photoresist to permit further fabrication. In some cases, the photoresist may be adequately removed by exposure to a suitable solvent. In other cases, however, the photoresist may be rendered insoluble to common solvents by the fabrication step which had been performed. For example, ion implantation, radiation accompanying plasma etching and any other process raising the wafer temperature above 150° C. to 200° C. for a significant time, will frequently cause the photoresist material to become heavily cross-linked, making it particularly difficult to remove.

When the photoresist material becomes highly cross-linked, it begins to behave as a gel. When the cross-linking approaches 100% (unity), the resist is no longer soluble in any solvent and instead will only swell when exposed to even the strongest solvent for the starting polymer material.

In addition to cross-linking, contamination of a photoresist layer during a wafer fabrication step can also reduce its solubility. For example, when photoresist is used for patterning a silicon dioxide or aluminum layer during plasma etching, the organic photoresist material may become contaminated by silicon, aluminum, or other inorganic materials. Such contaminated photoresists are frequently refractory to normal solvent removal.

Alternative removal techniques for refractory photoresists include several rigorous and often harsh processes. For example, thermal and photochemical oxidation of the photoresists have been employed. While generally effective, to assure sufficiently rapid processing, such oxidation requires elevated temperatures, typically in the range from 150° C. to 250° C. for photochemical oxidation and 250° C. to 300° C. for thermal oxidation. Such high temperatures can cause undesired diffusion within the semiconductor wafer, particularly resulting in diffusion of photoresist impurities into the device structures. Such high temperatures are unacceptable in many of today's integrated circuit manufacturing processes.

Removal of insoluble photoresist at lower temperatures, often below 100° C., can be achieved by "ashing" in an oxygen plasma. The plasma discharge required to effect such ashing, however, can itself result in damage to the wafer substrate. While attempts have been made to limit such damage by separating the plasma generation chamber from the treatment chamber, photoresist removal efficiency is significantly lowered with such designs. To compensate for such lower efficiency, the wafer temperature is often increased, again raising concerns over thermal damage.

Wet oxidative stripping of insoluble photoresists is also performed, typically using a sulfuric acid-hydrogen peroxide mixture referred to as a "piranha strip." Such wet stripping techniques, however, are generally ineffective at moderate temperatures and often require temperatures above 150° C. Frequently, wet stripping is performed only after an initial plasma ashing used to break through the upper region of the photoresist layer. In this way, the damage from the plasma can be minimized and the maximum temperature used during the wet stripping reduced. Such a combination of techniques, however, requires the use of separate reactors, is still rather slow, and uses relatively large amounts of wet chemicals.

For these reasons, it would be desirable to provide improved methods for removing insoluble (highly cross-linked) photoresist layers from semiconductor wafers at relatively low temperatures, preferably below about 40° C., and more preferably below about 30° C. Such removal methods should be rapid, preferably requiring a processing time below about 3 minutes for a single wafer, more preferably below about 1 minute, and require only the use of relatively simple, low cost equipment. The methods should also reduce the amount of treatment chemicals required, both to decrease the cost of the process and to reduce contamination generated by the process. The methods should further allow for the efficient cleaning and purification of the chemicals used, preferably allowing efficient point-of-use purification.

BACKGROUND OF THE INVENTION

U.S. Pat. No, 4,695,327, describes a process for removing impurities from microrecesses on surfaces, such as semiconductor wafer surfaces. A condensable solvent vapor is introduced to a chamber until a partial pressure just below the vapor pressure is reached. After several molecular layers are adsorbed in the microrecesses, the solvent partial pressure is increased above the vapor pressure to condense liquid solvent in the recesses. The removal of photoresists by combination of the solvent with a strong oxidizing agent is also described.

U.S. Pat. No. 4,778,536 describes the use of a vapor comprising sulfur trioxide and water, and U.S. Pat. No. 4,867,799 describes the use of a vapor comprising ammonia, water and/or hydrogen peroxide, to remove photoresist from semiconductor wafers.

U.S. Pat. No. 4,349,415, discloses a solvent extraction process where separation is improved by flashing the solvent at a pressure below its vapor pressure.

U.S. Pat. No. 3,969,196, discloses the use of a gas maintained under super critical conditions for separating organic compounds from mixtures.

SUMMARY OF THE INVENTION

According to the present invention, methods are provided for removing adherent matrix layers, more particularly highly cross-linked organic polymer layers such as photoresists, from substrates, such as semiconductor wafers. The methods are effective at relatively low temperatures, usually below about 40° C., and frequently below about 30° C., for at least most of the treatment cycle. The methods of the present invention are also quite rapid, usually requiring total treatment times less than about 3 minutes, frequently being less than about 1 minute, and often require the use of only a single solvent. Even when more than one solvent is utilized, the methods of the present invention can be performed in a single reactor, reducing the time and cost required for the process. The utilization of chemical solvents by the present invention is very efficient, with the treatment of a single semiconductor wafer often requiring less than 0.1 ml of solvent.

The method of the present invention comprises first exposing the adherent layer to a condensable vapor phase solvent under temperature and pressure conditions selected to allow penetration of the solvent into the matrix. After sufficient penetration has been achieved, the vapor phase solvent is condensed to produce a liquid phase within the adherent matrix, resulting in structural disruption of the matrix into non-adherent fragments, without substantial oxidation of the matrix. The fragments are then removed from the substrate surface.

In a specific embodiment of the present invention, the solvent vapor is delivered to a chamber holding the substrate, with the inlet vapor having a temperature above the chamber temperature and a vapor pressure above the saturation vapor pressure at the chamber temperature. The pressure of solvent vapor will decrease to below the saturation vapor pressure (at the chamber temperature) as it enters the chamber and will then be gradually increased to above the saturation vapor pressure whereby solvent vapor will have a sufficient time to penetrate the matrix, typically at least 30 seconds, usually at least 1 minute, and frequently at least 2 minutes, prior to condensing to cause the desired physical disruption. Conveniently, the pressure can be increased by continuing to deliver solvent vapor from a source at a pressure above the saturation vapor pressure (in the chamber) until equilibrium is achieved. Such high pressure solvent vapor can be provided by a source of liquid solvent heated to a temperature above the chamber temperature, usually to the desired delivery temperature. Vapor boiling off of the liquid solvent will have the desired temperature and pressure and will flow into the chamber from the resulting pressure gradient. Thus, no pumping or other potentially contaminating fluid transfer provisions are necessary.

Optionally, after the solvent is condensed within the adherent matrix, the pressure in the chamber may be abruptly reduced to cause revaporization or "flashing" of the liquid solvent within the matrix to further disrupt the structure. Heat may be applied at moderate temperatures to promote such flashing and to provide for heat losses from evaporation.

A second option is to expose the adherent matrix to a "pre-swelling" solvent prior to introducing the condensable vapor solvent. The pre-swelling solvent may itself be a vapor or a liquid and will serve to partially swell a cross-linked matrix to enhance subsequent penetration by the primary vapor solvent.

As a third option, the steps of solvent vapor exposure, condensation, and revaporization may be repeated one or more additional times to enhance disintegration of the adherent matrix layer.

Finally, the non-adherent fragments produced by the above steps may be removed by flowing a liquid or vapor stream over the substrate surface. The stream will usually be water or a solvent which removes the fragments and leaves the surface substantially clean.

DESCRIPTION OF THE PREFERRED EMBODIMENT

Figure 1:
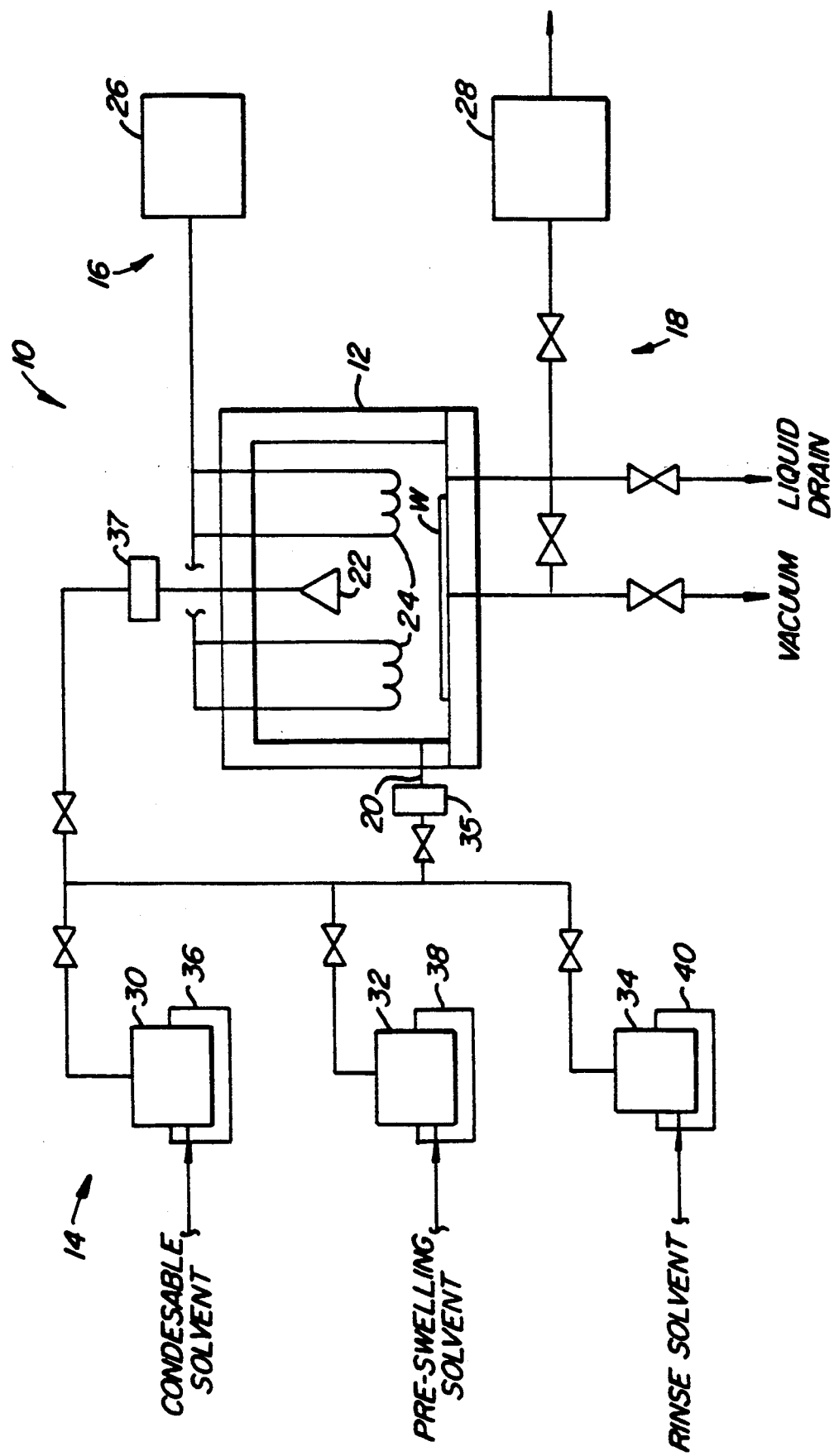
FIG. 1 is a schematic diagram illustrating a system which may be used for performing the method of the present invention.

The present invention is useful for removing a wide variety of adherent matrix layers which have been deposited over substrates, including both organic and inorganic matrix layers, and is particularly useful for removing cross-linked organic polymers which have limited solubility in, but are penetrable by, certain chemical and/or physical solvents. The present invention will find its greatest use in removing highly cross-linked photoresist present over semiconductor wafers, where removal has heretofore generally required either high temperature oxidation, plasma ashing, or combinations of both. The present invention can achieve removal of even highly refractory cross-linked photoresists, such as photoresists that have been hardened by exposure to certain wafer fabrication processes, at relatively low temperatures without exposure of the wafer substrate to potentially damaging radiation.

Thus, the present invention will find its greatest use as a part of otherwise conventional photolithographic processes for transferring patterns from a mask containing circuit-design information to the surface of a silicon wafer. In such processes, the wafer is first coated with a substantially continuous layer of photoresist which is then soft-baked to remove residual solvents, promote adhesion, and harden the resist. The resist is then exposed using a radiation source, usually a light source or electron beam source, through the preformed mask or by projection printing to selectively alter the characteristics of well defined portions of the photoresist. In the case of negative photoresists, an activator within the organic polymer matrix absorbs the radiation which in turn promotes cross-linking of the polymer. The cross-linked areas inhibit solubilization in the subsequent development step. In the case of positive photoresists, an inhibitor is present that prevents wetting and attack by the developer. Exposure to the radiation degrades the inhibitor, thus allowing the exposed regions to be removed upon subsequent exposure to the developer. After development, i.e., removal of the more soluble regions of the photoresist layer to expose the wafer thereunder, the photoresist is usually further baked to improve surface adhesion, increase the strength of the matrix, and drive off volatiles that have been retained from the developer. The patterned photoresist is then ready for use in a subsequent wafer fabrication operation, such as plasma etching, wet etching, ion implantation, sputtering, electroplating, and the like. Many of these processes, as discussed hereinabove, will result in further cross-linking or otherwise hardening of the remaining photoresist layer, rendering the layer refractory to many removal techniques. The present invention is advantageously used as a stripping process for removing the residual photoresist material after the desired wafer fabrication step has been completed.

The present invention relies on introducing a condensable solvent in its vapor phase so that it is able to penetrate deep within the matrix. The solvent should have a relatively high pressure, typically being at least about one atmosphere, usually being at least about several (three) atmospheres at room temperature, so that it can be vaporized and condensed at relatively moderate temperatures. The solvent should also have a high affinity to the matrix material to enhance solvation and swelling of the matrix.

The particular solvent selected will, of course, depend on the nature of the adherent matrix layer as well as the substrate. Suitable solvents will usually be non-oxidizing at the low temperatures required to practice the present invention, with exemplary solvents including ammonia, carbon dioxide, nitrous oxide, hydrocarbons, chlorofluorohydrocarbons, and the like for removal of cross-linked photoresists, the solvent should be volatile, with preferred solvents including ammonia, carbon dioxide, ethane, ethylene, propane, propylene, and the like. Ammonia is particularly preferred for use in removing photoresist and other cross-linked organic polymeric layers from substrates, such as semiconductor wafers.

The conditions for introducing the solvent to the adherent matrix are critical. The solvent will be introduced as a vapor, and the conditions should be selected to allow the solvent to remain in the vapor phase for a time sufficient to achieve penetration and wetting of the matrix. Typically, at least 30 seconds, and sometimes two or more minutes are allowed prior to condensation of the vapor phase to the liquid phase. In particular, it is important that the temperature of the substrate and surrounding the substrate be above the dew point at the initial solvent partial pressure and that the solvent vapor pressure be increased sufficiently slowly to delay condensation for the desired vapor exposure time. It has been found that initial condensation of the vapor on the surface of the adherent matrix inhibits penetration of the matrix by the vapor.

Conveniently, the substrate will be maintained within an enclosed chamber having means for controlling both the temperature and the pressure. The solvent is delivered to the chamber at a temperature above the initial chamber temperature and at a pressure above the saturation vapor pressure of the solvent at the chamber temperature. In this way, the vapor expands as it enters the chamber with its pressure falling below the saturation vapor pressure during the initial stage of vapor introduction. By limiting exhaust from the chamber, however, the pressure within the chamber will eventually increase to equal the solvent delivery pressure. Thus, as soon as the solvent pressure exceeds the saturation vapor pressure at the chamber temperature, condensation will begin to occur. Thus, the desired cycle of vapor introduction and condensation can be achieved by properly selecting the chamber temperature, initial chamber pressure, solvent vapor temperature, and initial solvent vapor pressure, and flow rate. Alternatively, a separate pumping system can be used for deliverying the solvent vapor to the chamber. Exemplary conditions for removing photoresist with ammonia are set forth in Table 1.

TABLE 1

| Conditions for Ammonia Vapor Delivery in Removing Photoresist | | |
|---|---|---|
| | Broad Range | Preferred Range |
| Chamber Temperature | 20° C.–80° C. | 25° C.–35° C. |
| Initial Chamber Pressure | Vacuum - 2 atm. | Atmospheric |
| Solvent Vapor Delivery Temperature | 40° C.–150° C. | 50° C.–80° C. |
| Solvent Vapor Delivery Pressure | 20–2000 psig | Saturation[1] |
| Solvent Flow Rate[2] | 0.01–1 | 0.05–0.5 |

[1] At the solvent delivery temperature.
[2] Average value in reactor volumes/minute at delivery temperature and pressure. When flow is from fixed pressure source, the flow rate will decrease as the pressure gradient decreases.

Condensation of the solvent vapor within the adherent matrix causes swelling which can physically degrade the structure of the matrix in numerous locations. Such structural degradation can be enhanced by revaporizing the condensed solvent, typically by an abrupt decrease in the chamber pressure, allowing the solvent to flash within the matrix structure. When such flashing is desired, it is beneficial to heat the substrate to provide the necessary heat of vaporization.

Such vapor condensation and optionally revaporization will cause significant breakdown and fragmentation of the adherent matrix layer. In many cases, the breakdown will be sufficiently complete so that the resulting fragments can be removed by blowing with a clean, inert gas, such as nitrogen, or by washing with distilled water. In the case of highly refractory matrix layers, however, it may be necessary to remove the fragments by washing or spraying with a suitable solvent, such as an alcohol, ketone, ether, ester, or the like.

In the case of highly refractory adherent matrix layers, it may also be desirable to treat the matrix with a pre-swelling solvent prior to penetration and condensation of the condensable solvent. Suitable pre-swelling solvents include dimethyl sulfoxide (DMSO), dimethyl formamide (DMF), N-methyl-2-pyrrolidone, (NMP), tetrahydrofuran (THF), methyl isobutylketone, (MIBK), isopropyl alcohol (IPA), acetone, and the like. The purpose of the pre-swelling solvent is to provide an initial penetration and swelling of the matrix layer to enhance subsequent penetration with the condensable solvent.

The efficacy of the present invention may be further enhanced by repeating treatment with the condensable vapor solvent one or more times. That is, after the solvent has been introduced as a vapor, condensed, and revaporized, the steps may be again repeated using either the same condensable solvent or a different condensable solvent. Each cycle of treatment will be expected t further breakdown the structure of the adherent matrix layer, facilitating the removal of highly refractory matrices.

After the structure of the matrix has been adequately broken down, the fragments can be removed from the substrate surface by a variety of techniques. In many cases, it will be sufficient to blow the surface clean using a stream of air, nitrogen, oxygen, or (if additional solvation is desired) an organic solvent vapor, typically oriented at an angle from 30° to 90° relative to the surface. The surface could alternatively be washed with distilled water or (again if additional solvation is desired) a liquid organic solvent. Suitable organic solvents include any of those listed above, either as the pre-swelling solvent or the condensable solvent.

Referring now to FIG. 1, a system suitable for performing the method of the present invention to remove a photoresist layer from a wafer W will be described. The system 10 includes a chamber 12, a solvent supply manifold 14, a temperature control system 16, and a solvent removal system 18. The treatment chamber 12 is connected to the solvent supply manifold 14 by a solvent delivery line 20 and a solvent vapor spray nozzle 22. Internal heating elements 24 are connected to a heater controller 26 which can control the delivery of heat internal chamber temperature, substrate temperature, or a combination of the two. It will be appreciated that additional heating elements may be provided beneath the wafer W, and elsewhere, to enhance either heating of the chamber or direct heating of the wafer W.

Typically, the valves of the supply manifold 14 and removal system 18 as well as the temperature control system 16 will be managed by a central control system (not illustrated), which will usually be a dedicated or shared computer. Also, a wafer handling system (not illustrated) will usually be provided for transferring wafer to and from the system 10.

Chamber 12 is connected to a vacuum source, liquid drain, and vapor treatment unit 28 as part of the solvent removal system 18. Manifold valves are provided so that the vacuum, liquid drain, or vapor treatment unit 28 may be selectively connected to beneath the wafer substrate W and/or adjacent to the wafer substrate. Conveniently, the wafer W may be placed on a vacuum chuck (not illustrated) which holds the wafer during the treatment process.

A variety of solvents, vapors, liquids, and the like, are supplied to the chamber 12 from holding vessels 30, 32, and 34. Depending on the nature of the solvent, the holding vessels may be provided with heat jackets 36, 38, and 40, respectively. In this way, the solvent may be introduced to the holding vessel as a liquid, and if desired, vaporized in the holding vessel and delivered to the chamber 12 by the resulting pressure gradient between the holding vessel and the chamber. Such preheating will almost always be done in the case of the condensable solvent in vessel 30 and may optionally be done with the pre-swelling solvent and rinse solvent in vessels 32 and 34, respectively. The solvents from any of the vessels 30, 32, or 34, may be selectively directed to either the side solvent delivery line 20 or the spray nozzle 22 by appropriately controlling the valves which ar part of the solvent supply manifold 14. In-line filters 35 and 37 will be provided for removing contaminants from the vapor entering through line 20 and nozzle 22, respectively. Suitable filters include dense, porous materials, such as metals or ceramics. At moderate flow rates, even very small particles (approximately 0.01 $\mu$m) can be removed with very high efficiencies approaching 100%.

The wafer W will be initially introduced to chamber 12, typically using conventional wafer handling equipment (not illustrated). After placement of the wafer W, the chamber 12 will be sealed and the interior may be optionally evacuated or flushed with an inert gas, such as nitrogen. The pre-swelling solvent will next be introduced (if desired) from vessel 32, followed by introduction of the condensable solvent from vessel 30. The temperature within chamber 12 will be controlled using controller 26 while the temperature and pressure of the condensable solvent vapor will be controlled using heat jacket 36. After the condensable solvent vapor is introduced and the pressure raised within the chamber 12 so that the solvent condenses within the adherent layer on wafer W, the pressure will be reduced by venting the remaining vapor through exhaust system 18. Any condensed solvent or other liquids will also be removed at this time.

The fragmented matrix layer may then be removed, for example by rinsing with solvent from vessel 34. Any of the alternative protocols may also be performed, as described above, using system 10.

The following examples are offered by way of illustration, not by way of limitation.

EXPERIMENTAL

Photoresist (Shipley 1813) Was spun onto 125 mm diameter semiconductor wafers to a thickness of 1300 nm. The photoresist layer was soft-baked at 90° C. for one minute, followed by hard-baking on a hot plate at 250° C. for at least 10 minutes. Such hard baking resulted in nearly complete cross-linking of the novolac photoresist material. The final thickness of the photoresist was in the range from about 900 to 950 nm.

The semiconductor wafer having the hard baked photoresist layer was placed in the high pressure chamber of an experimental system similar to that illustrated in FIG. 1 The initial chamber temperature was maintained at 30° C., and saturated ammonia vapor at 40° C. (210 psig) was when introduced to the chamber. The ammonia vapor was allowed to enter chamber until pressure equilibrium was reached at about 200 psig, taking approximately 2 minutes. After pressure equilibrium had been reached, the inlet valves were closed and outlet valves opened in order to allow a rapid decompression, taking less than 1 minute. The heaters were turned on to provide sufficient heat to enhance revaporization and boiling of the condensed ammonia within the photoresist layer.

It was found that the single treatment with the ammonia vapor resulted in substantial crazing of the entire photoresist layer. The smooth, specularly reflective surface of the original photoresist layer became cracked, with parts of the damaged layer being visibly detached from the wafer. The interface between the wafer and the entire photoresist layer was substantially weakened, allowing easy separation of the photoresist layer from the wafer.

A second photoresist layer was applied to a semiconductor wafer, as described above. Instead of hard baking the layer, however, the photoresist was cross-linked by a large dose of ion bombardment. The photoresist layer was previously patterned to produce features in the range from 5 to 100 $\mu$m by 100 $\mu$m. The photoresist was found to be insoluble in certain strong solvents for the non-cross-linked materials, such as DMSO, NMP, and DMF. Moreover, treatment of the wafers in ammonia as described above for the hard baked photoresist samples, yielded only minor fragmentation of the photoresist, particularly in the peripheral area of the larger features. The photoresist was not removed by subsequent rinses in either water or isopropyl alcohol.

It was found, however, that pretreatment with DMSO vapor at 35° C., followed by exposure to ammonia as described above for the hard baked photoresist samples, resulted in substantially complete disintegration of the photoresist features. Such combined treatment allowed removal of the photoresist with isopropyl alcohol applied as a liquid sprayed under pressure from the overhead spray nozzle.

Although the foregoing invention has been described in detail for purposes of clarity of understanding, it will be obvious that certain modifications may be practiced within the scope of the appended claims.

What is claimed is:

1. A method for removing an adherent matrix which is a cross-linked photoresist which has been hardened by baking, ion implantation, ultraviolet radiation, or exposure to a plasma from a substrate surface, said method comprising:

exposing the adherent matrix to a non-oxidizing vapor phase solvent for at least 30 seconds under temperature and pressure conditions selected to allow penetration of the vapor phase solvent into the matrix while the matrix remains substantially intact, wherein said solvent has a vapor pressure of at least one atmosphere at room temperature;

condensing the vapor phase solvent after the matrix has been penetrated but while the matrix remains intact to produce a liquid phase within the adherent matrix, whereby the matrix is structurally disrupted without substantial oxidation to produce non-adherent fragments; and removing the fragments from the substrate surface.

2. A method as in claim 1, wherein the substrate is a semiconductor wafer.

3. A method as in claim 1, wherein the solvent is selected from the group consisting of ammonia, carbon dioxide, nitrous oxide, hydrocarbons, and chlorofluorocarbons.

4. A method as in claim 1, further comprising exposing the adherent matrix to a preswelling solvent prior to exposing to the vapor phase solvent.

5. A method as in claim 4, wherein the preswelling solvent is selected from the group consisting of DMSO, DMF, NMP, THF, IPA, MIBK, and acetone.

6. A method as in claim 5, wherein the preswelling solvent is exposed to the matrix as a vapor.

7. A method as in claim 5, wherein the preswelling solvent is exposed to the matrix as a liquid.

8. A method as in claim 1, further comprising repeating the steps of exposing the adherent matrix to the vapor phase solvent and condensing the vapor phase solvent at least once prior to removing the fragments.

9. A method as in claim 1, wherein the step of removing the fragments comprises washing the substrate surface with a liquid organic solvent or water.

10. A method as in claim 1, wherein the step of removing the fragments comprises blowing a stream of air, nitrogen, oxygen, or organic solvent vapor against the surface.

11. A method for removing an adherent matrix which is a cross-linked photoresist which has been hardened by baking, ion implantation, ultraviolet radiation, or exposure to a plasma from a surface of a substrate, said method comprising:

placing the substrate within a chamber;
    maintaining a preselected temperature within the chamber;
    delivering to the chamber a non-oxidizing solvent vapor at a temperature above the chamber temperature and at a pressure below the saturation vapor pressure at the chamber temperature, wherein said solvent has a vapor pressure of at least three atmospheres at room temperature;
    increasing the pressure of the solvent vapor within the chamber from an initial value below the saturation vapor pressure to a subsequent value above the saturation vapor pressure, whereby the solvent initially penetrates the matrix while in the vapor phase and thereafter condenses to physically disrupt the matrix to produce fragments; and
    removing the fragments from the substrate surface.

12. A method as in claim 11, wherein the substrate is a semiconductor wafer.

13. A method as in claim 11, wherein the solvent is selected from the group consisting of ammonia, carbon dioxide, nitrous oxide, hydrocarbons, and chlorofluorocarbons.

14. A method as in claim 11, further comprising exposing the adherent matrix to a preswelling solvent prior to exposing to the vapor phase solvent.

15. A method as in claim 14, wherein the preswelling solvent is selected from the group consisting of DMSO, DMF, NMP, THF, IPA, MIBK, and acetone.

16. A method as in claim 15, wherein the preswelling solvent is exposed to the matrix as a vapor.

17. A method as in claim 15, wherein the preswelling solvent is exposed to the matrix as a liquid.

18. A method as in claim 11, further comprising decreasing the pressure in the chamber to a value below the saturation vapor pressure, whereby the liquid phase solvent revaporizes to further physically disrupt the matrix.

19. A method as in claim 18, further comprising repeating the steps of delivering a solvent vapor to the chamber and increasing the pressure of solvent within the chamber at least once after decreasing the pressure to revaporize the solvent and prior to removing the fragments.

20. A method as in claim 11, wherein the adherent matrix is exposed to the vapor phase solvent for at least 30 seconds prior to condensation.

21. A method as in claim 11, wherein the step of removing the fragments comprises washing the substrate surface with a liquid organic solvent or water.

22. A method as in claim 11, wherein the step of removing the fragments comprises blowing a stream of air, nitrogen, oxygen, or organic solvent vapor against the surface.

23. A method as in claim 11, wherein the pressure of the solvent vapor delivered to the chamber is the saturation vapor pressure at the solvent delivery temperature.

24. A method as in claim 23, wherein the solvent vapor is delivered to the chamber from a source maintained at said temperature above the chamber temperature, whereby a saturated solvent vapor phase is produced which flows to the chamber under a natural pressure gradient.

25. A method as in claim 24, wherein the pressure in the chamber is controlled by permitting equilibrium to be achieved between the source and the chamber.

26. A method for removing "an adherent matrix which is a cross-linked photoresist which has been hardened by baking, ion implantation, ultraviolet radiation, or exposure to a plasma" from the surface of a semiconductor wafer, said method comprising:

placing the wafer within a chamber;
    maintaining a preselected temperature within the chamber;
    connecting the chamber to a source of solvent consisting essentially of ammonia which has been heated to a temperature above the preselected chamber temperature, whereby the saturation vapor pressure of the ammonia at the source is sufficient to cause ammonia vapor to flow into the chamber;

allowing the source and the chamber to reach equilibrium pressure, whereby ammonia vapor which has penetrated the cross-linked organic polymer condenses at the lower chamber temperature to physically disrupt the polymer and produce fragments; and removing the fragments from the water surface.

27. A method as in claim 26, further comprising exposing the cross-linked photoresist to a preswelling solvent prior to exposing to the ammonia.

28. A method as in claim 27, wherein the preswelling solvent is selected from the group consisting of DMSO, DMF, NMP, THF, IPA, MIBK, and acetone.

29. A method as in claim 28, wherein the preswelling solvent is exposed to the matrix as a vapor.

30. A method as in claim 28, wherein the preswelling solvent is exposed to the matrix as a liquid.

31. A method as in claim 26, further comprising decreasing the pressure in the chamber to a value below the saturation vapor pressure, whereby the condensed ammonia revaporizes to further physically disrupt the matrix.

32. A method as in claim 31, further comprising reconnecting the chamber to the source of ammonia and allowing the chamber and source to reach pressure equilibrium after decreasing the chamber pressure and prior to removing the fragments.

33. A method as in claim 26, wherein the adherent matrix is exposed to the vapor phase solvent for at least 30 seconds prior to condensation.

34. A method as in claim 26, wherein the step of removing the fragments comprises washing the substrate surface with a liquid organic solvent or water.

35. A method as in claim 26, wherein the step of removing the fragments comprises blowing a stream of air, nitrogen, oxygen, or organic solvent vapor against the surface.

36. A method as in claim 26, wherein the preselected chamber temperature is in the range from about 20° C. to 80° C. and the source temperature is in the range from about 40° C. to 150° C.

* * * * *